(12) United States Patent
Chang

(10) Patent No.: US 6,400,540 B1
(45) Date of Patent: Jun. 4, 2002

(54) CLAMP CIRCUIT TO PREVENT ESD DAMAGE TO AN INTEGRATED CIRCUIT

(75) Inventor: Jiashann Chang, Cupertino, CA (US)

(73) Assignee: Sil.able Inc., Los Gatos, CA (US)

( * ) Notice: Subject to any disclaimer, the term of this patent is extended or adjusted under 35 U.S.C. 154(b) by 0 days.

(21) Appl. No.: 09/524,417

(22) Filed: Mar. 11, 2000

Related U.S. Application Data

(60) Provisional application No. 60/124,106, filed on Mar. 12, 1999.

(51) Int. Cl.[7] .............................. H02H 9/00; H01L 23/62
(52) U.S. Cl. ........................................ 361/56; 257/357
(58) Field of Search ............................ 361/18, 56, 58, 361/89, 91, 94, 111; 257/355, 356, 357, 360, 361, 362

(56) References Cited

U.S. PATENT DOCUMENTS

| | | | |
|---|---|---|---|
| 5,239,440 A | * 8/1993 | Merrill | 361/91 |
| 5,708,549 A | * 1/1998 | Croft | 361/56 |
| 5,734,186 A | * 3/1998 | Honnigford et al. | 257/360 |
| 5,978,192 A | * 11/1999 | Young et al. | 361/56 |
| 6,125,021 A | * 9/2000 | Duvvury et al. | 361/56 |

\* cited by examiner

*Primary Examiner*—Matthew Nguyen

(57) ABSTRACT

In an integrated circuit device requiring electrostatic discharge (ESD) protection, a circuit is added between a power supply bus and a ground supply bus to shunt the ESD event current and thereby avoiding damage to the device. Specifically, the circuit uses bipolar junction transistors of the PNP type to shunt the supply buses. The emitter junctions are connected to the positive supply bus. The collector junctions are connected to the ground bus. The PNP transistors conduct when a control circuit senses an ESD event and increases the base current in the PNP transistor.

2 Claims, 8 Drawing Sheets

CLAMP CIRCUIT TO PREVENT ESD DAMAGE TO AN INTEGRATED CIRCUIT

CONTINUING DATA

This application claims benefit of No. 60/124,106 filed on Mar. 12, 1999.

CROSS REFERENCE TO RELATED APPLICATIONS

Not Applicable

STATEMENT REGARDING FEDERALLY SPONSORED RESEARCH OR DEVELOPMENT

Not Applicable

REFERENCE TO MICROFICHE APPENDIX

Not Applicable

BACKGROUND OF THE INVENTION

The present invention relates to the field of electrical safety systems using on-chip protection elements to prevent damage to the device. More particularly, the present invention relates to circuits and devices for providing electrostatic discharge protection between power supply buses and the ground bus in a CMOS integrated circuit.

The accumulation of static electricity in the vicinity of an integrated circuit (IC) exposes the circuit to a potential failure in the form of an electrostatic discharge (ESD) event. This event refers to the phenomena in which the high static potential (ranging from hundred to thousand of volts) causes a discharge of current in excess of an ampere to flow between at least two external terminals of an integrated circuit. The ESD event current, if not properly handled within the integrated circuit, has the potential to disable or destroy the entire integrated circuit.

IC designs contain additional devices and circuits to handle the ESD event. These additional devices and circuits operate during an ESD event. When in the normal operating mode, the circuit terminals function at the normal design potential while either sending and receiving electrical signals from circuitry external to the IC or receiving power from circuitry external to the IC. The circuit network that conducts the ESD current, the ESD network, is required to conduct the ESD current and thereby reducing any potential damage to itself or to the remainder of the IC. The ESD damage to the IC must remain below detectable limits. It is highly desirable that the same ESD network causes negligible performance impact on the normal mode circuit function. As the ESD event is a fast transient event, the peak ESD event current flowing in the first few nanoseconds, the ESD network must conduct this fast transient current. During the normal mode of IC operation, the ESD network must not conduct any transient current.

To reduce the cost of implementing the ESD network, it is desirable to minimize the area of the IC used just for said network. As a result of this, where possible, the ESD network uses some IC devices and circuits that are also used during the normal operating mode of the IC. In CMOS, all the NMOS and PMOS transistors contain diodes between their sources and drains; and the particular well in which they are physically located. In the normal mode of operation, the proper external power is supplied to the IC and these diodes are biases between zero and some reverse bias resulting in a minimal current flow though the diodes. During an ESD event, power is not applied and these transistor diodes may be forward biased by the ESD event itself and conduct current accordingly.

In particular, CMOS output circuits or combination input-and-output circuits use a combination of large NMOS and large PMOS transistors. These large transistors, the output transistors, are connected to the IC external terminals. The drains of the output transistors form the cathode or the anode of large diodes wherein the opposite diode terminal is connected to the respective well of each output transistor. The n type well for the PMOS transistor is connected to VDD, the positive or power supply potential in the IC. The p type well for the NMOS transistor is connected to the ground potential in the IC. In the most commercially prevalent CMOS, all p type wells are connected together through additional p type material which results in all n type wells individually forming diode connections with the one p type material at ground potential. Some ICs use ESD networks which add additional diodes in parallel to the diodes that are an integral part of the output transistors. This practice improves the diode connectivity between the IC external terminals and the power buses internal to the IC.

During testing of an IC, the ESD event is caused to occur between pairs of the external terminals with the polarity of current applied one way and then a similar ESD event is applied with the external terminals reversed. As there are diodes between the external terminal pins and both the power and ground buses, the result of the applied ESD potential is that the ESD network routes the ESD current into the power and ground buses through the appropriate forward biased diodes. To complete the network and safely pass the ESD current through the network, the ESD current must pass between the power and ground bus. There are two possible polarities for the ESD current, both of which the ESD network must handle as a result of the reversal of the external terminals during ESD testing.

The most strenuous ESD event for the ESD network to handle is the situation in which the both external terminals used for the ESD testing are connected to output or input-and-output circuits. In other ESD test combinations, a least one external terminal is a power or ground terminal. These test conditions are less strenuous for the ESD network.

If in the ESD event the polarity of the event causes current to flow into the first terminal, that is the first terminal is at a more positive potential than the second terminal, the ESD event current is conducted readily from the first terminal to the power bus by means of the forward biased PMOS transistor drain inside the n type well connected to the power bus. Similarly, the ESD event current will flow out of the second terminal through the forward biased NMOS transistor drain inside the p type well connected to the ground bus. The ESD event current must also flow between the power bus and the ground bus to complete the current conduction loop from the first terminal to the second terminal thereby passing the ESD current safely through the IC and avoiding damage to the IC.

In normal operation the power supply potential is greater than the ground potential and a minimal current flows between the n type wells and the p type wells. Without additional devices and circuits in the ESD network, the ESD event current only passes from the power bus to ground bus by means of AC current, that current which is proportional to the product of the rate of change of the difference of the power and ground bus potentials; and the capacitance between buses. In some IC designs, the capacitance between the power and ground that exists between the p type wells and n type wells together with the rapid change in the relative bus potentials caused by the ESD event provides sufficient ESD current flow to protect the IC from damage. If insufficient capacitance is unavailable or cannot be feasibly added to the IC, the ESD network conducts the current from the power bus to the ground bus by an appropriate collection of devices and circuits, the ESD power to ground clamp, also called an ESD power to ground shunt. The ESD clamp must conduct the ESD event current while not being damaged by the event, not conducting current during the normal operation of the IC, and not being physically large as to adversely affect the cost of the IC.

A variety of clamp circuits have been used with ICs. These clamps consist of a primary device to carry the current and a control circuit to condition the primary conduction device to conduct during an ESD event, but not conduct under normal IC operation. The primary conduction devices that have previously been used in CMOS ICs are the NMOS transistor, the PMOS transistor, and a special device called a silicon controlled rectifier (SCR). Puar in U.S. Pat. No. 5,287,241 describes an ESD network using a PMOS clamping circuit. Dabral in the 1994 EOS/ESD Symposium Proceedings describes and NMOS clamping circuit. Ker in U.S. Pat. No. 6,011,681 used an SCR clamp. Each of these primary conduction devices has their respect advantages and disadvantages. The NMOS transistor has a high conductivity, but is itself susceptible to damage by the ESD event. The PMOS transistor is more rugged than the NMOS type, but the PMOS is less than half the conductivity per unit area when compared to the NMOS type. The SCR is both highly conductive and rugged, but difficult to appropriately control. Both Voldman in 1994 EOS/ESD Symposium Proceedings and Maloney in U.S. Pat. No. 5,530,612 discuss diodes that function as clamp circuits that result in parasitic PNP transistors for use between isolated power buses.

The clamping circuit requires that the control circuitry be relatively simple, spatially compact, electrically rugged, and also reliable, triggering the conduction of the primary conduction device only during the ESD event. The primary feature of most ESD control circuits is their use of the fast transient nature of the ESD event to trigger the conduction device. The control circuits switch the conducting device to the conducting state when the power bus to ground bus potential increases faster than a certain rate and the increase is greater than a certain value. In some cases, the clamp circuit may become conductive simply when a certain power bus to ground bus potential is exceeded. Dugan in U.S. Pat. No. 5,311,391 describes improvements to the control circuitry and thereby minimize triggering the ESD conducting device when the IC is in normal operation. Ker in the 1998 EOS/ESD Symposium Proceedings reported techniques for improving the SCRs used as conduction devices and their control circuitry, but at the expense of additional area and circuit complexity.

BRIEF SUMMARY OF THE INVENTION

Accordingly, several objects and advantages of this invention are gained by the use of a PNP transistor as the conduction device to shunt the ESD current from the power bus to the ground bus. The PNP transistor is more robust than the NMOS transistor, can conduct more current than the PMOS transistor, and is more easily controlled than the SCR. The PNP transistor base current can be supplied by an NMOS or PMOS transistor, or directly by a diode string or diode-connected-FET string, if the leakage current from said string is sufficiently low.

The PNP transistor may be implemented as a lateral PNP device, a vertical PNP device or as a combination of the two within the same CMOS technology. The p type well that forms the PNP collectors are all connected together. This common collector connection further serves to improve the conduction of the PNP transistor.

The technique of using a PNP can be extended by physically implementing a Darlington type connection of two PNP transistors, in place of the single PNP conduction device thereby increasing the equivalent PNP current gain. As the current gain of the PNP increases, the PNP sensitivity to leakage into its base from the control circuit increases accordingly. For the purposes of this invention, the single PNP can be replace by a pair of Darlington connected PNPs without otherwise changing the clamp circuit connections or altering the control circuitry operation.

Still further objects and advantages will become apparent from a consideration of the ensuing description and accompanying drawings.

DETAILED DESCRIPTION OF THE INVENTION

Figure 1:
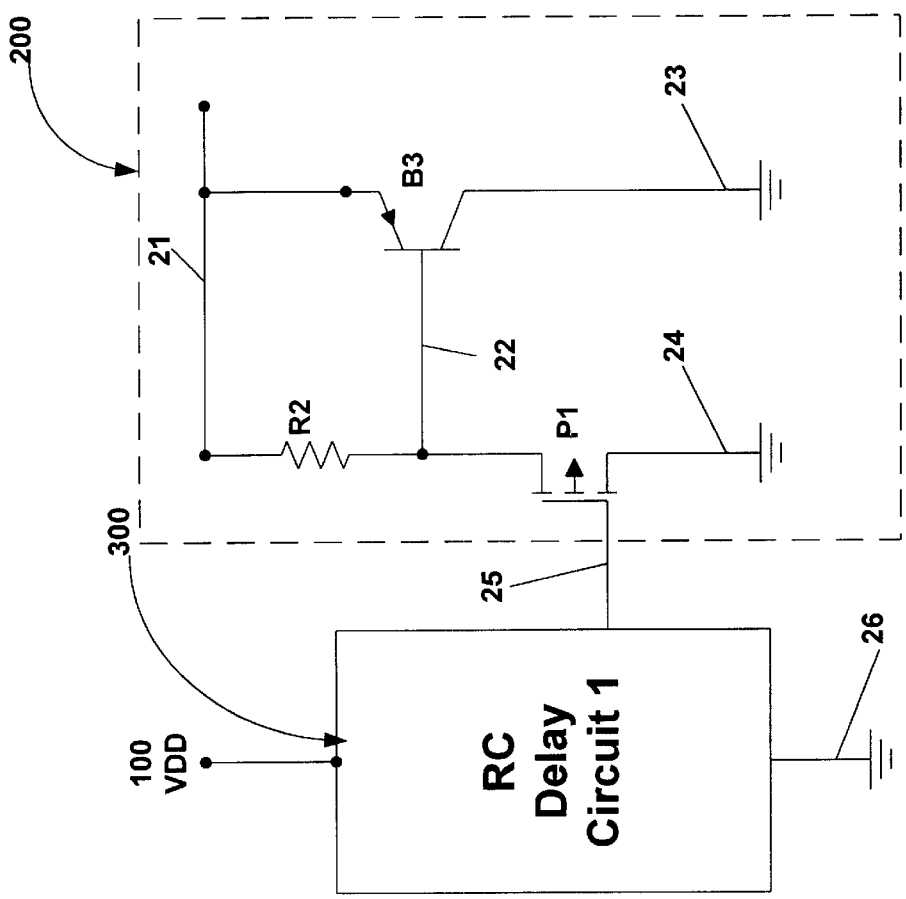
FIG. 1 is a perspective view of a circuit diagram of clamp circuit which the invention is applied.

The circuit diagram of the present invention is shown in FIG. 1. The clamp circuit consists of two circuit blocks as shown in FIG. 1 which are (1) the current discharge circuit 200 which provides a current discharge path triggered by the potential at node 25 and (2) a delay circuit 300 (which is termed an RC delay even though the delay may be the result of factors other than R & C) which provides a power up delay signal at node 25. As shown in FIG. 1, the current discharge circuit 200 consists of a resistor R2, a PNP bipolar transistor B3, and a P-channel MOS transistor P1. This invention is applicable to a conventional P-type substrate complementary metal-oxide silicon (CMOS) technology. The PNP bipolar transistor B3 can be a lateral PNP bipolar transistor or a vertical PNP bipolar transistor or can use both lateral and vertical PNP bipolar transistors as a pair. Alternately, a Darlington connections of two PNP transistors can function in an equivalent manner to a single PNP transistor throughout this description.

Figure 2:
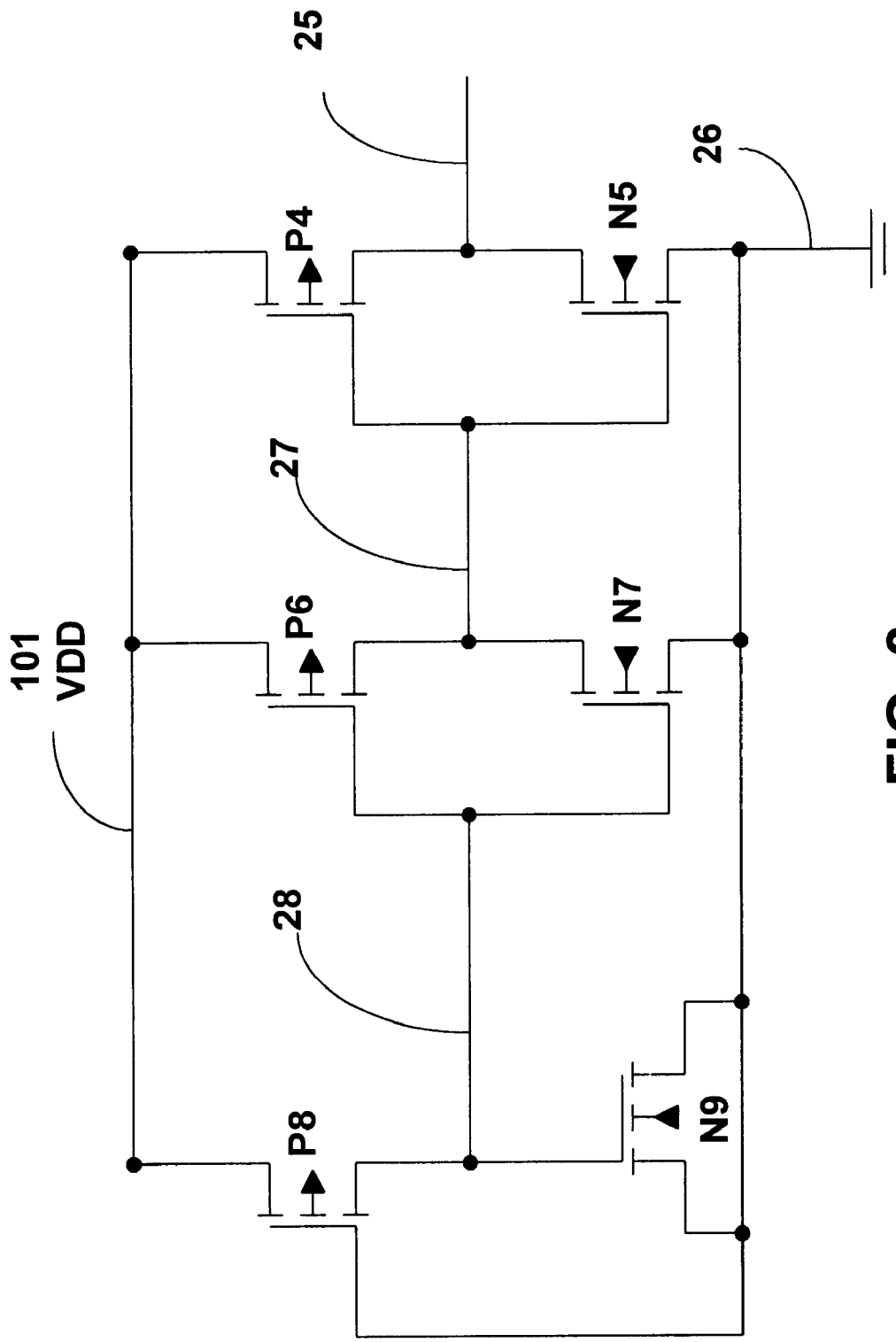
FIG. 2 is a circuit diagram of an RC delay circuit indicated in FIG. 1.

The detailed circuit diagram of RC delay circuit 300 is shown in FIG. 2. Node 26 is connected to ground (zero volts) in the chip. Node 101 is connected to a positive supply voltage VDD. The RC delay circuit 300 generates a signal at node 25 which follows the increase in power supply VDD with a delay period 91 shown in FIG. 3. The duration of a delay time 91 depends on the resistance of P8 and the capacitance of N9.

Figure 3:
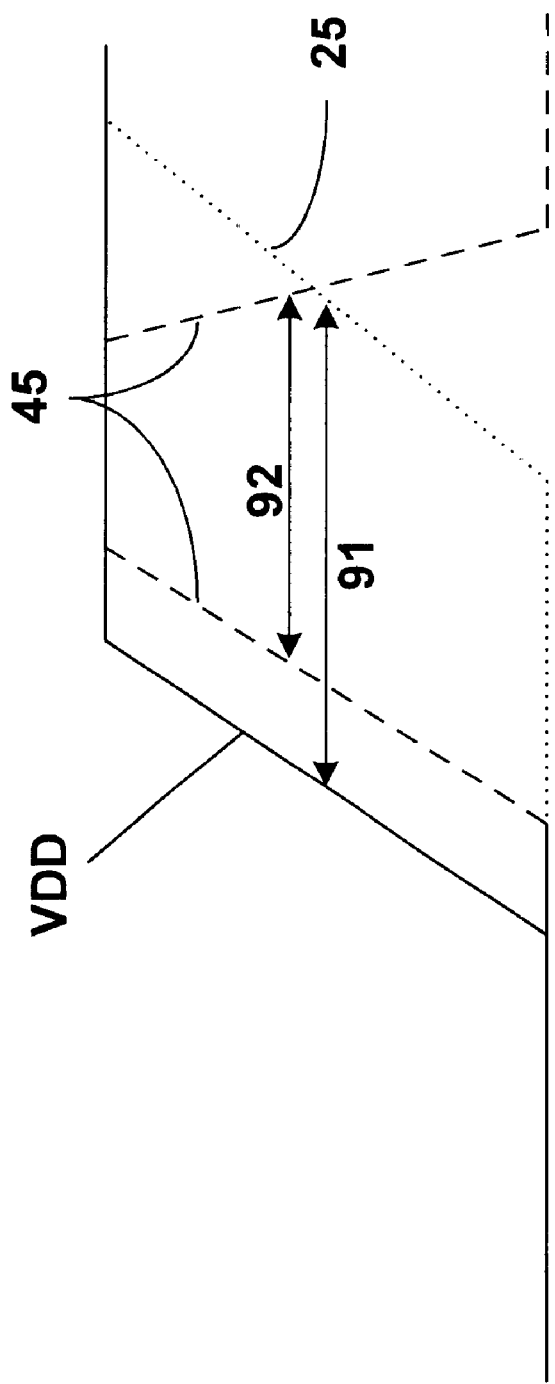
FIG. 3 is a voltage waveform of VDD, node 25 of FIG. 1 and node 45 of FIG. 6.

When the power supply is not connected to the IC, the voltage level of 101 is near zero volts and all the internal nodes in FIGS. 2, 25, 26, 27 and 28 are also near zero volts. As the voltage of VDD 101 rises, which is driven by the ESD transient voltage, transistor P8, P6, and P4 begin to turn on and to conduct current from VDD (node 101) to charge up node 28, 27 and 25. With a combination of the high transistor on-resistance value of P8 and a high gate capacitance value of N9, node 28 rises slowly in comparison to the rise time of VDD. For the time period 91 shown in FIG. 3, node 28 stays at a relatively low voltage to keep transistor P6 and N5 conducting. The voltage level of node 25 is low which keeps P1 of FIG. 1 conducting. A conducting P1 provides current for current-discharge circuit 200 from node 22 to ground 24. After a delay period 91, shown in FIG. 3, from the rising edge of VDD, nodes 28 and 25 have charged up to a higher voltage level which in turn makes transistor P1 non-conducting and thus stops the current flow through R2 and B3 in FIG. 1. The delay time 91 shown in FIG. 3 is determined by Ron of P8, and Cgate of N9 that can be adjusted by varying the channel widths and lengths of P8 and N9. In the normal IC operation mode, the voltage level of node 101 is nearly constant at VDD. The voltage level of nodes 28 and 25 are also near VDD level and node 27 is near zero volts (ground level).

As shown in FIG. 1, node 24 and 23 are connected to the IC ground level (zero volts). Resistor R2 can be P diffusion resistor, N-well resistor, N diffusion resistor, polysilicon resistor or MOS transistor. PNP bipolar transistor B3 can be lateral PNP transistor or vertical PNP transistor or a combination of lateral and vertical transistors in parallel. PNP bipolar transistor B3 can also be a combination of two lateral or vertical PNP transistors in the Darlington configuration. The VDD (node 100) of the RC delay circuit 300 rises from zero due to the ESD transient current. During a time period 91 shown in FIG. 3 the voltage level of node 25 generated by RC delay circuit 300 is low or closed to zero. Transistor P1 of current discharge circuit 200 is conducting and conducts current from node 22 to ground node 24. The total current passing through P1 consists of the current through resistor R2 from node 21 and base current of transistor B3 through the emitter of B3 connected to node 21. The resistance value of R2 will limit the current through R2 from node 21 since the base-to-emitter voltage, Vbe ( emitter to base voltage when the emitter-base junction is forward biased ), of B3 is nearly constant. Bipolar transistor B3 turns on and discharges current from node 21 to ground 23 directly. Current from node 21 to 23 of B3 is called Ice, which is the collector-to-emitter current. Ice approximately equals Beta times Ib. Beta is defined as the current gain of PNP transistor B3. Ib is the base current of B3. Therefore; there are two low resistance paths to discharge current from node 21 to nodes 23 and 24 during the period of time node 25 stays low and P1 stays conducting (which is controlled by RC delay circuit 300). These current paths are as follows:

(1) Current conducts from emitter to collector of bipolar transistor B3, and (2) Current conducts from drain to source of PMOS transistor P1.

R2 resistor in block 200 functions (1) to isolate the high voltage node 21 during the ESD transient current and to limit the drain current into PMOS transistor P1 to avoid any device damage to P1, and (2) to charge up node 22 to the same voltage potential of node 21 in the normal mode to which removes any base current from PNP transistor B3.

In the event that VDD (node 100) of RC delay circuit 300 does not rise when there is ESD transient current applied to the IC, node 25 will stay low to keep P1 and B3 on to discharge current from node 21 to the grounded nodes.

Figure 4:
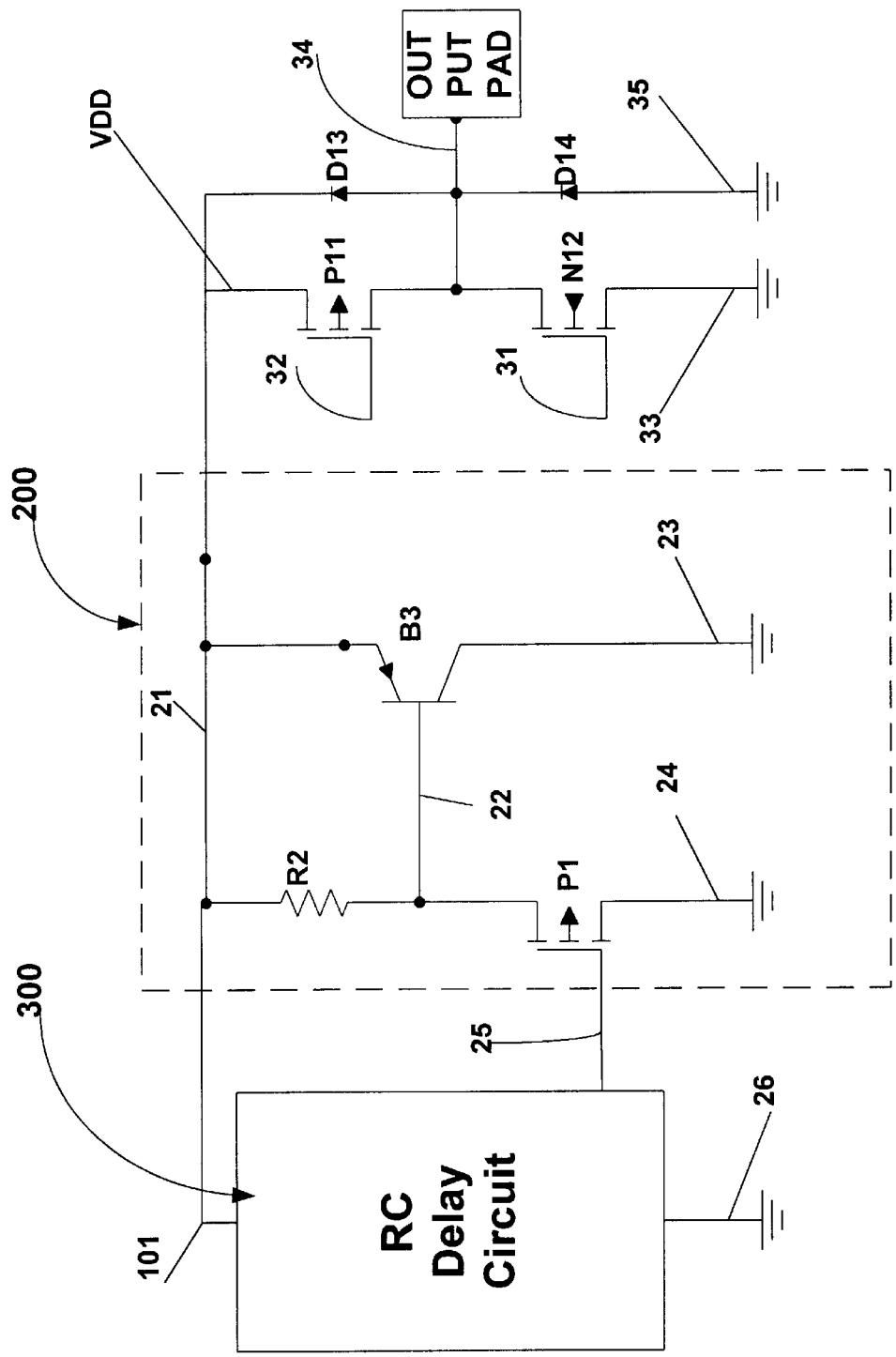
FIG. 4 is a circuit diagram of generic CMOS output circuit with the addition of the present invention.

FIG. 4 shows one example circuit application which uses the present invention to clamp the power supply to ground to prevent ESD damage to the IC. A pull-up PMOS transistor P11 and a pull-down NMOS transistor N12 are the driver transistors of the output buffer. The gate 32 of P11 and gate 31 of N12 are driven by the output buffer control circuitry which is not shown in the figures, but provided by other on-chip circuitry. Diode D13 is a diode connected from output pad 34 to VDD and D14 is diode connected from output pad 34 to ground. The nodes 23, 24, 26, 33, and 35 are connected to ground (zero volts). In the circuit diagram shown in FIG. 4, power supply VDD is connected to node 101 of RC delay circuit 300 and to node 21 of current discharge circuit 200. When a positive ESD transient voltage is applied to output pad 34, the diode D13 is forward biased and begins to charge VDD nodes 21 and 100 up from near zero volts. During the period of delay time 91 shown in FIG. 3 the bipolar transistor B3 and PMOS transistor P1 are all in a conducting state and discharge the ESD transient current from VDD to ground. The sizes of the bipolar transistor B3 and the PMOS transistor P1 are designed to be large enough to be capable of discharging the ESD transient current without allowing the high ESD transient voltage or current to damage any devices elsewhere in the IC. In the normal mode of IC operation, the voltage of nodes 25 and 22 are near the potential of node 21 and the two discharge transistors P1 and B3 all not conducting current form VDD to ground.

Figure 5:
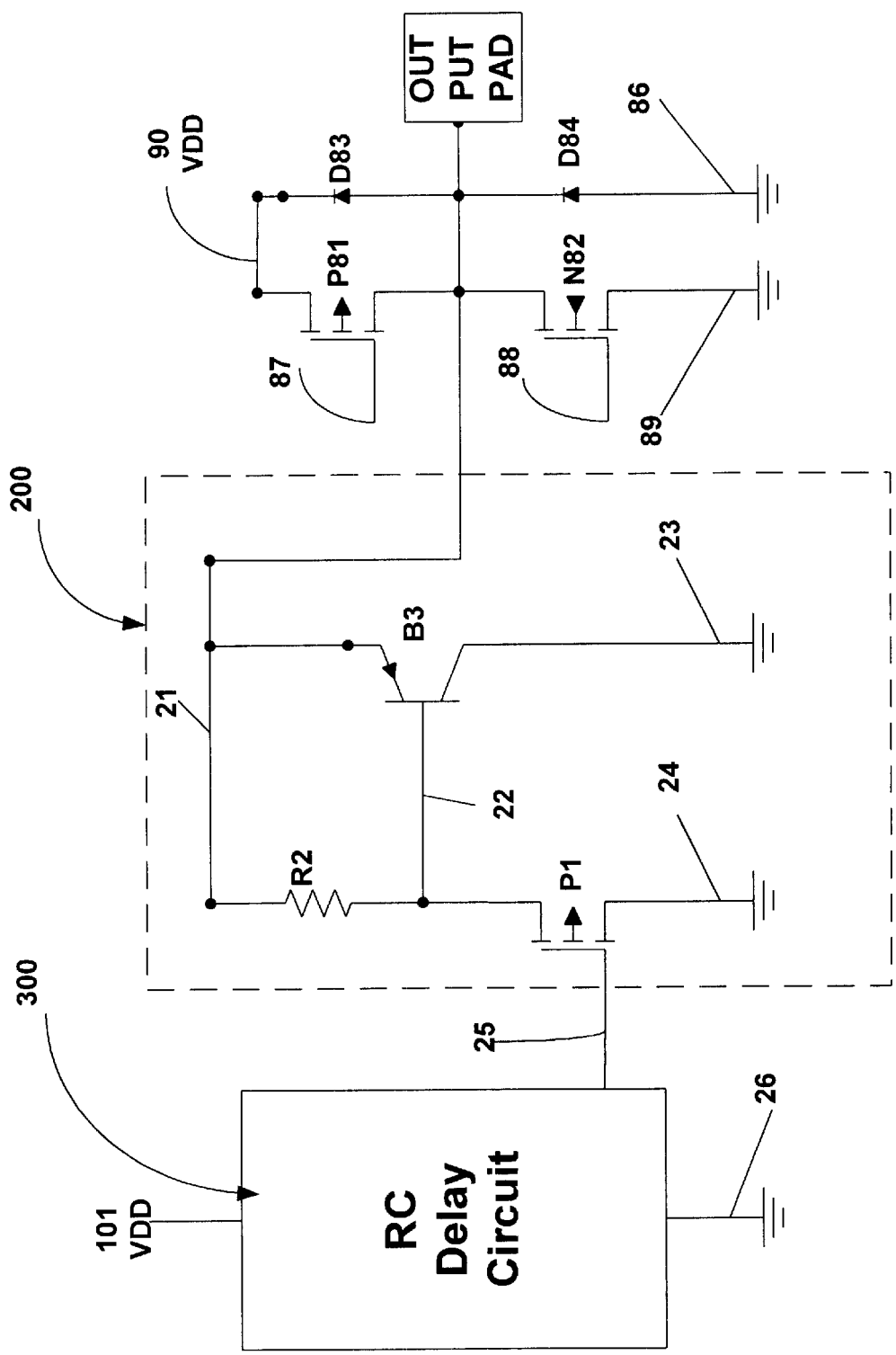
FIG. 5 is a circuit diagram of a generic CMOS output circuit with additions of alternative approach of this invention to be used as output ESD protection circuit.

Another example of circuit application which uses the present invention to discharge ESD transient current in order to prevent ESD damage of the IC is shown in FIG. 5. The node 21 of discharge circuit 200 is directly connected to the output pad. A pull-up PMOS transistor P81 and pull-down NMOS transistor N82 are the driver transistors of the output buffer. The gate 87 of P81 and gate 88 of N82 are driven by the output buffer control circuitry which is not shown here. Diode D83 is a diode connected from output pad to node 90 and D84 is a diode connected from output pad to ground. Nodes 23, 24, 26, 86, and 89 are connected to ground (zero volts). Nodes 90 and 101 of RC delay circuit 300 are connected to VDD (positive power supply). When the ESD transient current applies a positive voltage pulse to output pad shown in FIG. 5, the bipolar transistor B3 and PMOS transistor P1 are both turned on and conduct to discharge the ESD transient current from output pad to ground (primarily nodes 24 and 23) in the time period 91 in FIG. 3. The sizes of the bipolar transistor B3 and PMOS transistor P1 are designed to be large enough to discharge the ESD transient current without allowing the high ESD transient voltage or current to damage any devices elsewhere in the IC. After the RC delay time 91, the voltage of node 25 approaches VDD which renders transistor P1 non-conducting. Then, the voltage between nodes 22 and 21 is nearly equal to zero which shuts off bipolar transistor B3.

Figure 6:
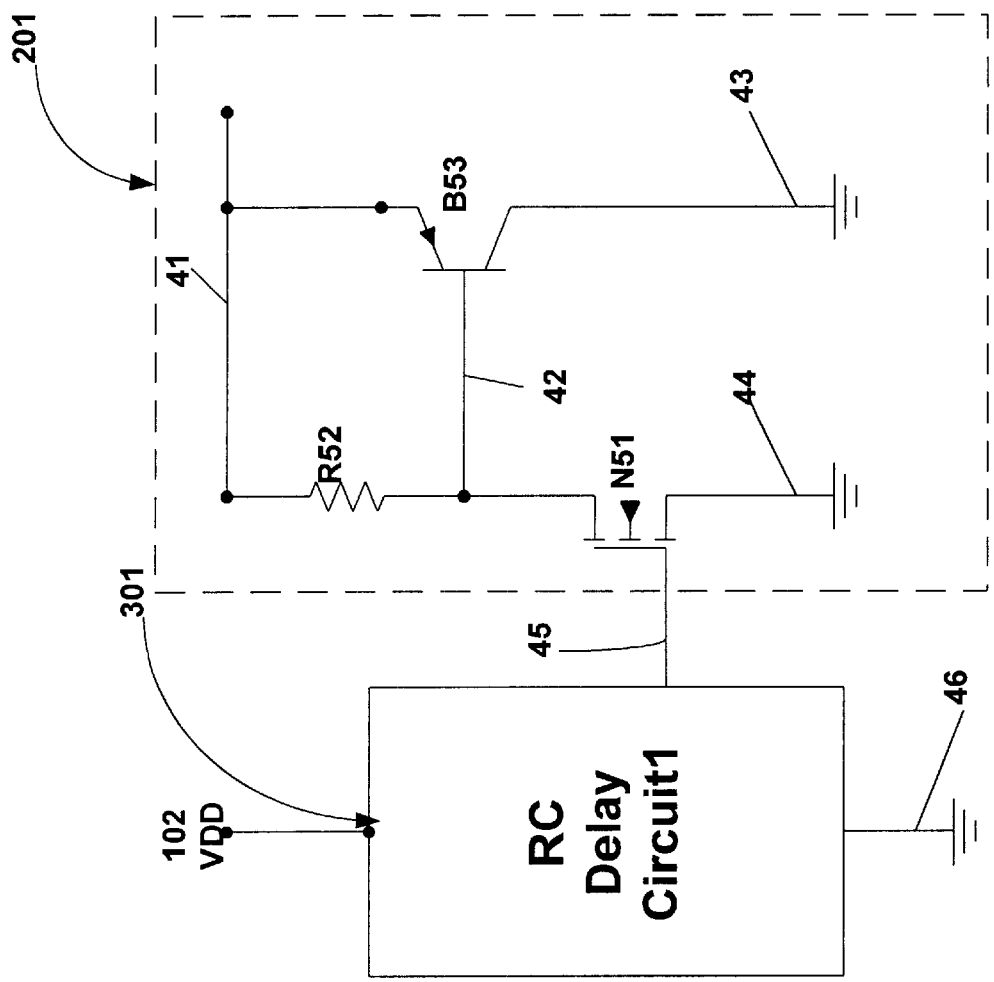
FIG. 6 is an alternative circuit diagram of the clamp circuit in which the present invention is applied.

FIG. 6 shows an alternative way to design the discharge circuit 201 according to this invention. Instead of using a P-channel MOS transistor P1 in block 200 of FIG. 1, P1 can be replaced by an N-channel MOS transistor N51 as shown in FIG. 6. The connectivity of the other components (R52 and B53) in block 201 is the same as R2 and B3 in block 200 in FIG. 1. Since an N-channel MOS transistor requires an opposite gate voltage to conduct than a P-channel MOS transistor, the RC delay circuit1 301 to generate the gate voltage 45 also needs to be modified. The detailed circuit diagram of RC delay circuit 102 is shown in FIG. 7.

Figure 7:
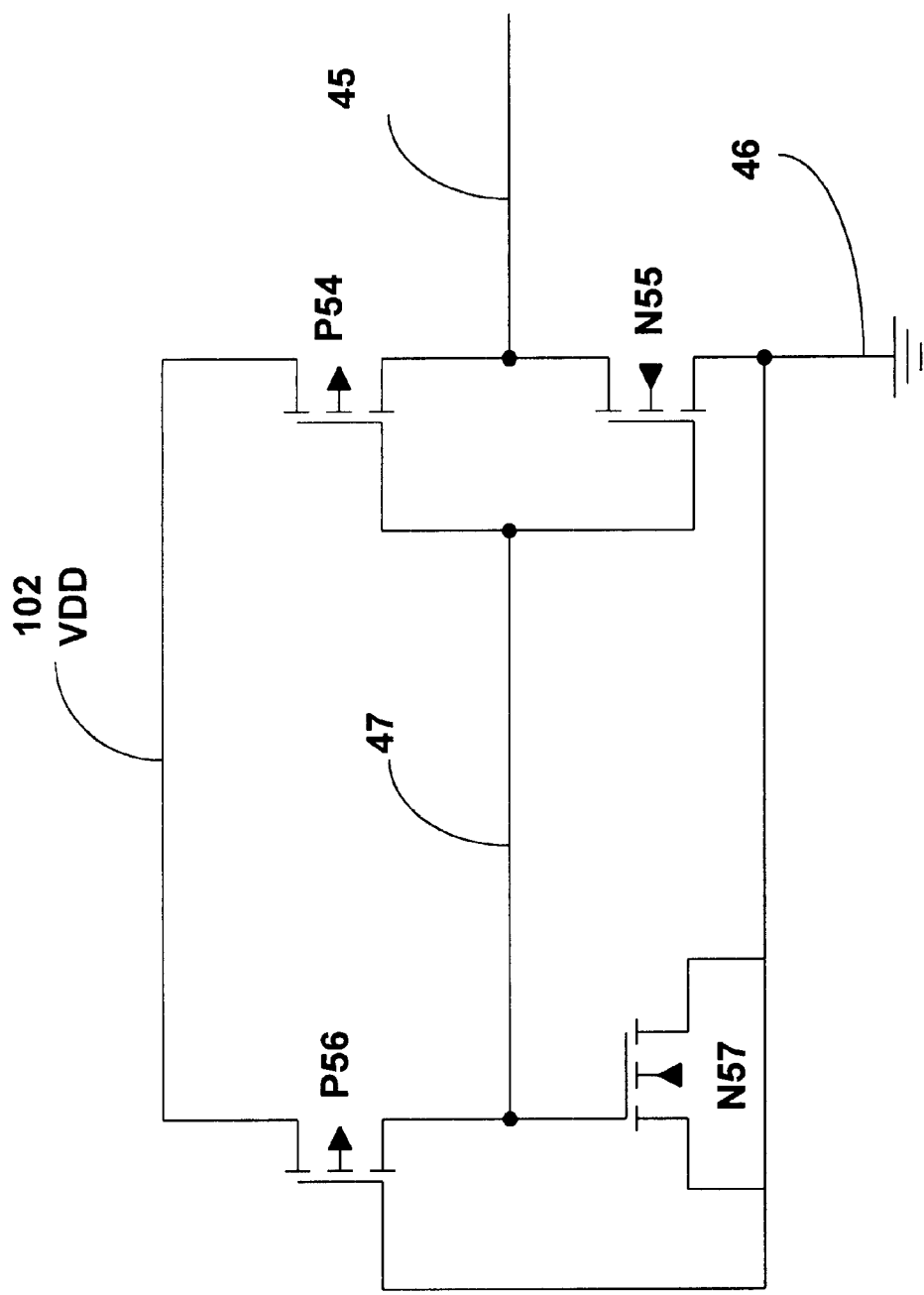
FIG. 7 is a circuit diagram of RC delay circuit 1 indicated in FIG. 6.

Node 46 in FIG. 7 is connected to ground which is the lowest potential in the chip, and node 102 is connected to the positive supply voltage VDD. When the power supply is not connected to the IC, the voltage level of 102 is near zero volts and the internal nodes 45 and 47 in FIG. 7 are also near zero volts. As VDD 102 rises driven by the ESD transient voltage, transistor P56 and P54 begin to conduct current from VDD (node 102) and charge up nodes 47 and 45. With a combination of the high transistor on resistance of P56 and a high gate capacitance value of N57, node 47 rises slowly in comparison to the rise time of VDD. In the time period 92 shown in FIG. 3, node 47 stays in a relatively low voltage which keeps transistor P54 conducting, and the voltage level of node 45 follows VDD. With node 45 near greater than the threshold voltage of transistor N51, transistor N51 of discharge circuit 201 conducts current from node 42 to ground 44 as shown in FIG. 6. After a delay period 92 shown in FIG. 3, node 47 has been charged up to high voltage level which causes transistors P54 and N51 to be non-conducting which stops the current flow through R2 and B53 as shown in FIG. 6. The delay time 92 shown in FIG. 3 is determined by the Ron of P56 and the Cgate of the gate of N57. The values of Ron and Cgate can be adjusted by varying the channel widths and lengths of P56 and N57. In the normal IC operation mode, the voltage level of node 102 is near the VDD value as is node 47. Node 45 is near the zero volt level (ground). In the normal IC operation there is no current path from node 41 to ground in discharge circuit block 201 in FIG. 7.

The voltage level of node 45 generated by RC delay circuit1 301 is high enough to keep transistor N51 conducting in the presence of ESD current pulse shown in FIG. 6. The circuit operation and concept of the discharge circuit 201 in FIG. 6 function the same as discharge circuit 200 in FIG. 1. Both circuits discharge the ESD transient current without letting the high ESD transient voltage or current damage devices elsewhere in the IC.

Figure 8:
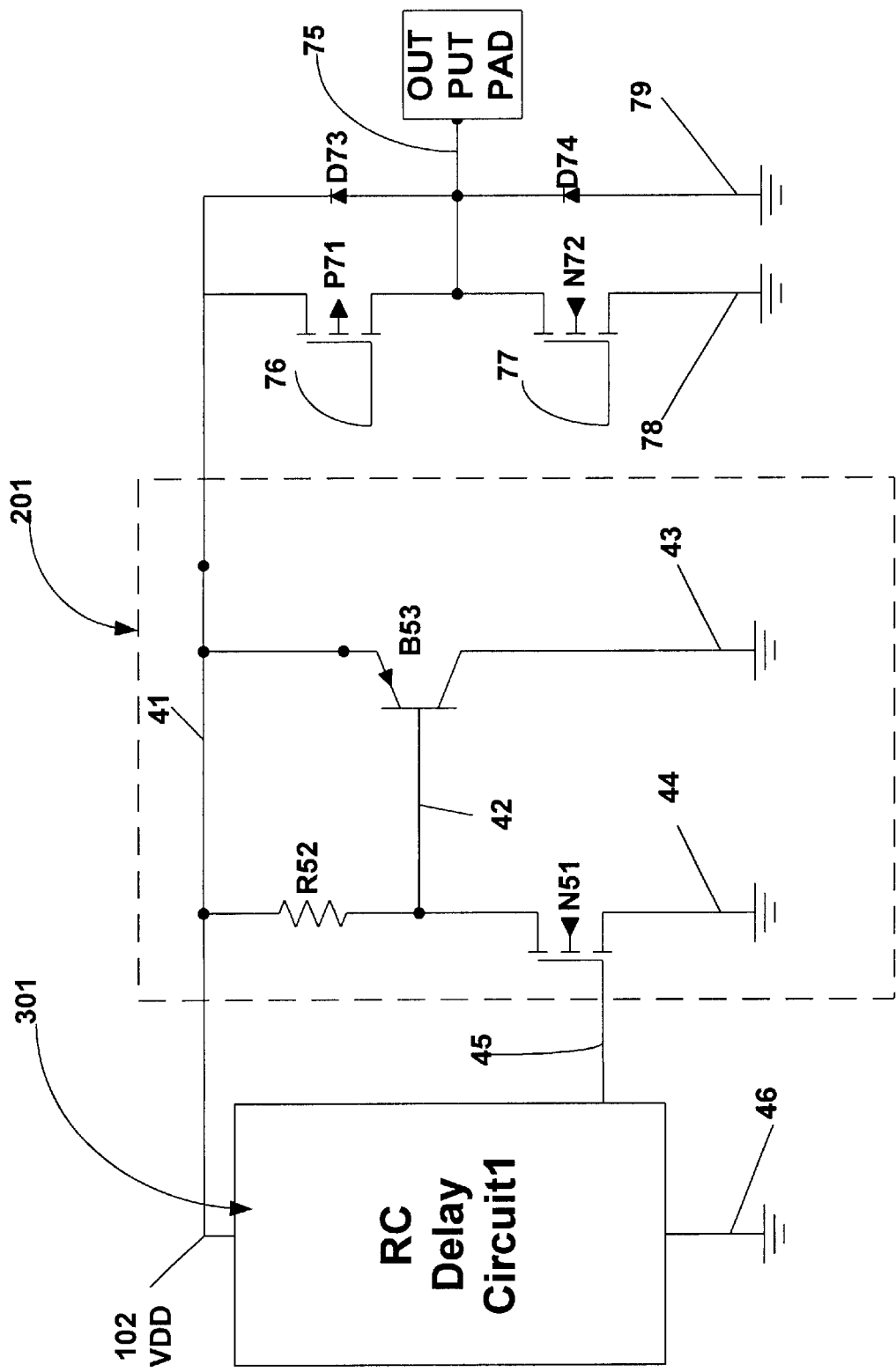
FIG. 8 is a circuit diagram of a generic CMOS output circuit with additions of a clamp circuit shown in FIG. 6.

FIG. 8 shows a circuit application example which uses the present invention of circuit diagram shown in FIG. 6 to clamp the power supply to ground to prevent ESD damage to the IC. The power supply VDD is connected to the source of P71, node 41 of discharge block 201, and VDD node of the RC delay circuit 301. A pull-up PMOS transistor P71 and pull-down NMOS transistor N72 are the driver transistors of output buffer. The gate 76 of P71 and gate 77 of N72 are driven by the output buffer control circuitry which is not shown here. Diode D73 is a diode connected from output pad 75 to VDD and D74 is a diode connected from output pad 75 to ground. The nodes 43, 44, 78, 79, and 46 are connected to ground (zero volts).

When a positive ESD transient voltage is applied to output pad 75, VDD power supply bus 41 is charged up by the ESD transient voltage through diode D73, During a period of delay time 92 shown in FIG. 3, the bipolar transistor B53 and NMOS transistor N51 are all conducting and discharge the ESD transient current from VDD 41 to ground (primarily nodes 44 and 43 ). The sizes of the bipolar transistor B53 and NMOS transistor N51 are designed to be large enough to discharge the ESD transient current without allowing the high ESD transient voltage or current to damage devices elsewhere in the IC. In the normal mode of operation, the potential of node 42 is near VDD and node 45 is near zero. Transistor N51 and B53 are non-conducting and no current is discharged through block 201 in FIG. 8.

What is claimed is:

1. An electrostatic discharge event protection circuit for a CMOS integrated circuit, at least part of which is a circuit between one of the power supply buses and one of the ground supply buses comprising;
   a. first a PNP transistor with emitter connected to a power supply bus and collector connected to a ground supply bus and the base connected to an NMOS transistor; and
   b. second an NMOS transistor with drain connected to the first PNP transistor base and source connected to the ground supply bus and gate connected to a delay circuit; and
   c. third a delay circuit connected at least to the power and ground buses that provides a positive potential relative to the ground bus into the NMOS transistor gate during an ESD event.

2. An electrostatic discharge event protection circuit for a CMOS integrated circuit, at least part of which is a circuit between one of the power supply buses and one of the ground supply buses comprising;
   a. first a PNP transistor with emitter connected to a power supply bus and collector connected to a ground supply bus and the base connected to a PMOS transistor; and
   b. second a PMOS transistor with source connected to the first PNP transistor base and drain connected to the ground supply bus and gate connected to a delay circuit; and
   c. third a delay circuit connected at least to the power and ground buses that provides a negative potential relative to the power supply bus into the PMOS transistor gate during an ESD event.

\* \* \* \* \*